United States Patent
Harman et al.

(10) Patent No.: US 7,179,986 B2
(45) Date of Patent: Feb. 20, 2007

(54) SELF-ASSEMBLED QUANTUM DOT SUPERLATTICE THERMOELECTRIC MATERIALS AND DEVICES

(75) Inventors: Theodore C. Harman, Lexington, MA (US); Patrick J. Taylor, Woburn, MA (US); Michael P. Walsh, Lunenburg, MA (US); Brian E. LaForge, Tyngsboro, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 516 days.

(21) Appl. No.: 10/431,747

(22) Filed: May 8, 2003

(65) Prior Publication Data

US 2004/0107988 A1 Jun. 10, 2004

Related U.S. Application Data

(60) Provisional application No. 60/378,784, filed on May 8, 2002.

(51) Int. Cl.
*H01L 35/00* (2006.01)

(52) U.S. Cl. ............... 136/200; 136/238; 136/239

(58) Field of Classification Search ............... 136/203, 136/200, 238, 239
See application file for complete search history.

(56) References Cited

U.S. PATENT DOCUMENTS 5,415,699 A  5/1995  Harman
6,605,772 B2 *  8/2003  Harman et al. ......... 136/236.1
2002/0172820 A1  11/2002  Majumdar et al.
2003/0099279 A1 *  5/2003  Venkatasubramanian et al. 374/179

FOREIGN PATENT DOCUMENTS

WO   WO 01/17035 A1   3/2001
WO   WO 01/31659 A2   5/2001
WO   WO 01/93343 A2   12/2001
WO   WO 03/032408 A1   4/2003

OTHER PUBLICATIONS

T.C. Harman, P.J. Taylor, D.L. Spears, and M.P. Walsh, "PbTe-Based Quantum-Dot Thermoelectric Materials with High ZT", 18th International Conference on Thermoelectrics, 1999, pp. 280-284.*
R. Venkatasubramanian et al., "Thin-Film Thermoelectric Devices with High Room-Temperature Figures of Merit", Nature Publishing, Oct. 2001, pp. 597-602.
M. Pinczolits et al., "Direct Formation of Self-Assembled Quantum Dots Under Tensile Strain By Heteroepitaxy of PBS on PBTE (111)", Applied Physics Letter, Jul. 1998, pp. 250-252.
H. Asahi, "Self-Organized Quantum Wires And Dots In III-V Semiconductors" Advanced Materials, Nov. 1997, pp. 1019-1026.
T.C. Harman et al., "PbTe-Based Quantum-Dot Thermoelectric Materials with High ZT", 18th International Conference on Thermoelectrics, Aug. 1999, pp. 280-284.

* cited by examiner

*Primary Examiner*—Nam Nguyen
*Assistant Examiner*—Anthony Fick
(74) *Attorney, Agent, or Firm*—Daly, Crowley, Mofford and Durkee, LLP (57) ABSTRACT

A thermoelectric (TE) device includes a first leg of TE material (a pseudobinary or pseudoternary alloy) and a second leg comprising a metal wire. The second leg is in thermal and electrical communication with the first leg. The TE device has a ZT value of approximately 2.0 at a temperature of approximately 300K.

13 Claims, 4 Drawing Sheets

Photo of Test Setup

For QDSL Sample: $\Delta T_{max} = \underline{43.7K}$

For $(Bi,Sb)_2(Te,Se)_3$
Bulk [ZT = 0.9]: $\Delta T_{max} = 30.8K$

SELF-ASSEMBLED QUANTUM DOT SUPERLATTICE THERMOELECTRIC MATERIALS AND DEVICES

CROSS REFERENCE TO RELATED APPLICATIONS

This application claims priority under 35 U.S.C. §119(e) to provisional application No. 60/378,784, filed May 8, 2002, the disclosure of which is incorporated by reference herein.

STATEMENTS REGARDING FEDERALLY SPONSORED RESEARCH

This work was sponsored by the Department of the Navy, the Army Research Office, and the Defense Advanced Research Projects Agency (DARPA) under AF Contract No. F19628-00-C-0002. The government has certain rights in the invention.

BACKGROUND OF THE INVENTION

As is known in the art, there exists a class of materials referred to as thermoelectric materials. A thermoelectric material is a type of material which can directly convert thermal energy into electrical energy or which can convert electrical energy into thermal energy.

A typical bulk thermoelectric device includes a section of P-type material that is in mechanical and electrical communication with a section of N-type material. The point at which the two materials contact each other is referred to as a "junction". Whenever electrical current flows through two dissimilar materials, depending on the direction of current flow through the materials, the junction of the P-type and N-type material will either absorb or release heat.

When the thermoelectric device is connected to a voltage source such that the P-type material is connected to the positive lead of the voltage source and the N-type material is connected to the negative lead of the voltage source a phenomenon takes place. The negative charge carriers, also known as electrons, in the N-type material are repelled by the negative potential and attracted to the positive potential of the voltage source. Similarly, the positive charge carriers, also known as holes, in the P-type material are repelled by the positive voltage potential and attracted by the negative potential of the voltage source. The charge carriers are carrying heat to the junction of the P-type and N-type material, thus the device is providing a heating function at the junction of the N-type and P-type materials.

Conversely, when the thermoelectric device is connected to a voltage source such that the N-type material is connected to the positive lead of the voltage source and the P-type material is connected to the negative lead of the voltage source, the opposite effect occurs. Charge carriers (electrons) in the N-type material are repelled by the negative potential and attracted to the positive potential of the voltage source. Similarly, the positive charge carriers (holes) in the P-type material are repelled by the positive voltage potential and attracted by the negative potential of the voltage source. The charge carriers are carrying heat away from the junction of the p-type and n-type material, thus the device is providing a cooling function at the junction of the P-type and N-type materials.

Given the pairing of N-type material with P-type material, it is common to believe that thermoelectric devices will function in a manner similar to a diode. However, this is not the case, since in a diode a depletion region is formed between the P-type material and the N-type material. When the diode is forward biased, charge carriers are drawn into the depletion region and the diode becomes conductive. When the diode is reverse biased charge carriers are drawn away from the depletion region and the diode acts as an open circuit. The thermoelectric device does not form a depletion region and therefore does not function in a manner similar to a diode. The thermoelectric device conducts in both directions and there is only a small voltage drop across the device.

Although certain thermoelectric materials have been known in the art for a number of years (e.g.—bulk semiconductors), it has only recently been found that thermoelectric materials having a superlattice structure can possess thermoelectric properties which are better than the corresponding thermoelectric properties of other thermoelectric materials.

A superlattice structure denotes a composite structure made of alternating ultrathin layers of different component materials. A superlattice structure typically has an energy band structure which is different than, but related to, the energy band structures of its component materials. The selection of the component materials of a superlattice structure, and the addition of relative amounts of those component materials, will primarily determine the resulting properties of a superlattice structure as well as whether, and by how much, those properties will differ from those of the superlattice structure's component material antecedents.

It is generally known that thermoelectric materials and thermoelectric materials having a superlattice structure find application in the fields of power generation systems, and the heating and/or cooling of materials. One problem, however, is that although these fields place ever-increasing demands on thermoelectric materials to possess ever-improving thermoelectric performance characteristics, the thermoelectric materials and thermoelectric materials having a superlattice structure known in the art have, as of yet, not been able to keep pace with such performance demands.

One way to predict the thermoelectric behavior of thermoelectric materials or thermoelectric materials having a superlattice structure in the fields of power generations systems, and the heating and/or cooling of materials is to calculate a thermoelectric figure of merit for the materials. The thermoelectric figure of merit, ZT, is a dimensionless material parameter in which T corresponds to temperature and Z is the figure of merit. ZT is a measure of the utility of a given thermoelectric material or thermoelectric materials having a superlattice structure in power generation systems, and heating and/or cooling applications at a temperature T.

The relationship of ZT to the material properties of thermoelectric materials and thermoelectric materials having a superlattice structure is shown by the following equation:

The dimensionless materials (or intrinsic) TE figure of merit ZT is defined as follows $$ZT = S^2 T / \rho \kappa \qquad (1)$$

where T is the temperature, S is the Seebeck coefficient or thermopower, $\rho$ is the electrical resistivity, and $\kappa$ is the thermal conductivity.

Generally, it is known in the art that it is desirable for thermoelectric materials to have a relatively high value for their thermoelectric figure of merit (ZT) in order for those thermoelectric materials to perform well in the fields of power generation systems and the heating and/or cooling of materials. From inspection of the above equation, it appears that to provide a thermoelectric material having a high ZT, one need only fabricate on it a superlattice structure having relatively high values for its Seebeck coefficient and its temperature while, at the same time, having a relatively low value for its thermal conductivity and resistivity. It has proven difficult in practice to provide a thermoelectric material or a thermoelectric material having a superlattice structure that has a high thermoelectric figure of merit (ZT) value.

As is also known in the art, multilayer systems prepared by molecular beam epitaxy (MBE) can provide materials having improved thermoelectric properties. Superlattice systems having reduced dimensionality have been proposed as a means to greatly enhance the thermoelectric figure of merit (ZT) as a result of the effects of confinement on the electronic density of states. It has also been shown that additional effects need to be included in order to obtain a more complete understanding of these complex structures.

The above discoveries have led to increasing interest in quantum-well and quantum-wire superlattice structures in the search to find improved thermoelectric materials for applications in cooling and power generation. Investigation of $Pb_{1-x}Eu_xTe/PbTe$ quantum-well superlattices grown by MBE yielded an enhanced ZT due to the quantum confinement of electrons in the well part of the superlattice structure have been conducted.

Quantum wells have two-dimensional carrier confinement whereas quantum wires have one-dimensional confinement of the carriers. Quantum wires have been calculated to have much higher ZTs than quantum wells due to improved confinement. And, it has been recognized that quantum dots (QDs) have even higher ZT values than quantum wires.

Quantum dots have zero-dimensional confinement and represent the ultimate in reduced dimensionality, i.e. zero dimensionality. The energy of an electron confined in a small volume by a potential barrier as in a QD is strongly quantized, i.e., the energy spectrum is discrete. For QDs the conduction band offset and/or strain between the QD and the surrounding material act as the confining potential. The quantization of energy, or alternatively, the reduction of the dimensionality is directly reflected in the dependence of the density of states on energy. For a zero-dimensional system (e.g. a QD superlattice), the density of states (dN/dE) of the confined electrons has the shape of a delta-like function $$(dN/dE) \alpha \sum_{\epsilon_i} \delta(E - \epsilon_i)$$

where $\epsilon_i$ is discrete energy level and $\delta$ is the Dirac function. Thus, an enhanced density of states is a possibility even in partially confined QD superlattice (QDSL) structures.

Solid state thermoelectric (TE) cooling and electrical power generation devices can be fabricated using QDSL materials. TE devices have many attractive features compared to other methods of refrigeration/electrical power generation. These features include long life of the device, an absence of moving parts, non-emissions of toxic gases (hence environmentally friendly), low maintenance, and high reliability. Despite the features associated with TE devices however, widespread use in many applications has been limited by relatively low energy conversion efficiencies.

Quasi-zero-dimensional Quantum dot Superlattice (QDSL) structures, having a delta-function distribution of density of states and discrete energy levels due to three-dimensional quantum confinement, a potentially more favorable carrier scattering mechanism, and a much lower lattice thermal conductivity, provide the possibility of much more efficient thermoelectric devices. The growth of self-assembled QDSL materials on planar substrates using the Stranski-Krastanov growth mode, yields improved TE figures of merit. Epitaxially grown PbSeTe/PbTe (ternary) QDSL materials yielded a conservatively estimated room temperature TE figures of merit of 0.9.

SUMMARY OF THE INVENTION

A thermoelectric (TE) device is described. The TE device includes a first leg of TE material (a pseudobinary or pseudoternary alloy) and a second leg comprising a metal wire. The second leg is in thermal and electrical communication with the first leg. The TE device has a ZT value of approximately 2.0 at a temperature of approximately 300K.

BRIEF DESCRIPTION OF THE DRAWINGS

The invention will be better understood by reference to the following more detailed description and accompanying drawings in which.

DETAILED DESCRIPTION

The present application discloses the growth of the QDSL materials, the characteristics of the n-type and p-type QDSL TE materials, the fabrication and demonstration of a cooling device from the nanostructured unusually thick film materials (104 μm in thickness), and the cooling device characteristics obtained from such a device. The number of degrees cooling that was measured in the n-type QDSL/metal wire device is significantly greater than the amount of cooling achieved in a high quality n-type bulk $(Bi,Sb)_2(Se,Te)_3$ solid solution alloy/metal wire TE device.

Quaternary PbSnSeTe QDSL structures were grown having comparable Seebeck coefficient values to the PbSeTe/PbTe QDSL structures but the quaternary materials are designed to have lower energy gaps (Eg), higher power factors, and reduced lattice thermal conductivities, which results in higher ZT values.

In order to calculate the desired compositions of the QD $Pb_{1-x}Sn_xSe_yTe_{1-y}$ layers embedded in PbTe matrices grown on $BaF_2$ (111) substrates by MBE, the following relationships for energy gap, Eg (eV) and lattice constant $a_0$ (Å) was used:

$$Eg(eV) = 0.18 + 4.4 \times 10^{-4}T - 0.05y - 0.52x - 0.37xy \quad (2)$$

where T is the temperature in degrees Kelvin, x is the mole fraction for the matrix layer and y is the mole fraction for the QD layer and $$a_0(\text{Å}) = 6.461 - 0.3345y - 0.134x + 0.0175xy \quad (3)$$

Figure 1:
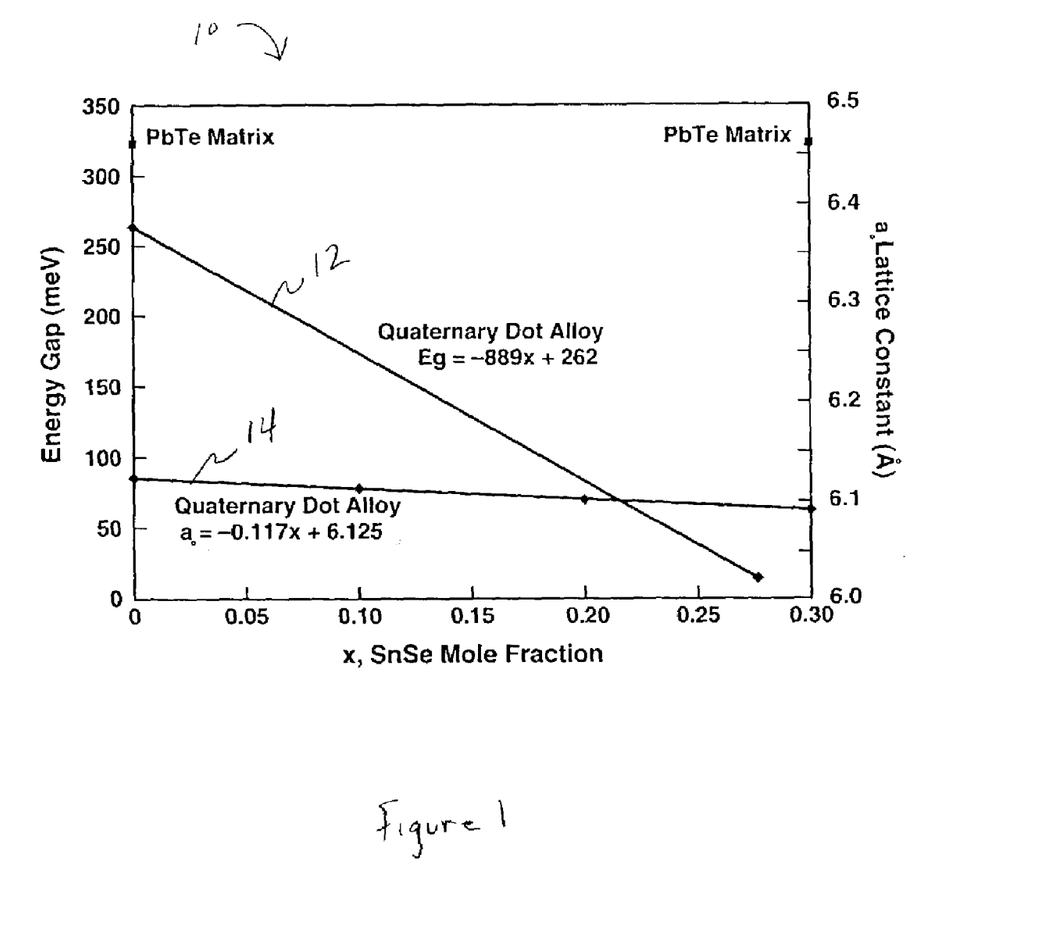
FIG. 1 is a graph showing the Energy Gap (EG) and Lattice Constant versus SnSe mole fraction.

Referring now to FIG. 1, a graph 10 shows the Eg and lattice constant versus mole fraction SnSe 12 for the QD/wetting layer component (PbSnSeTe) of the QD materials developed. Also, the Eg and lattice constant 14 of the PbTe matrix layer component is indicated in FIG. 1.

In Tables Ia and Ib shown below, the measured Seebeck coefficient, carrier concentration and carrier mobility (the latter two properties calculated from van der Pauw measurements), and the calculated materials TE figure of merit are displayed for the various PbSeTe QDSL samples (the lattice thermal conductivity calculated from the G-218 device test data is discussed later).

TABLE Ia

300-K thermoelectric properties of thick film Bi-doped (n-type) PbSe$_{0.98}$Te$_{0.02}$/PbTe samples grown by MBE.

| Sample No. | Seebeck Coefficient (μV/K) | ZT* | Carrier Concentration (cm$^{-3}$) | Carrier Mobility (cm$^2$/V-s) |
|---|---|---|---|---|
| G-207 | −219 | 1.6 | 1.2 × 10$^{19}$ | 370 |
| G-218 | −208 | 1.3 | 1.1 × 10$^{19}$ | 300 |

TABLE Ib

300-K Thermoelectric Properties of Thick Film Tl-Doped (p-type) PbSe$_{0.98}$Te$_{0.02}$/PbTe Samples Grown by MBE.

| Sample No. | Seebeck Coefficient (μV/K) | ZT* | Carrier Concentration (cm$^{-3}$) | Carrier Mobility (cm$^2$/V-s) |
|---|---|---|---|---|
| G-215 | +248 | 0.8 | 2.7 × 10$^{18}$ | 440 |
| G-216 | +165 | 0.9 | 1.8 × 10$^{19}$ | 260 |

The equivalent alloy composition (EAC), x, where x is defined in the ternary alloy expression PbSe$_x$Te$_{1-x}$, is 0.98 for the films. Data on bulk samples of PbSe indicate that the Seebeck coefficient of PbSe follows the same curve as PbTe and both may be described by the following empirical Seebeck coefficient, S, vs carrier concentration, n, relationship, i.e.

$$S(\mu V/K) = -477 + 175 \log_{10}(n/10^{17} cm^{-3}) \quad (4)$$

The Seebeck coefficients of the n-type PbSe$_{0.98}$Te$_{0.02}$/PbTe QDSL samples are much greater than the values calculated from the S vs n relationship of Equation (4). It is seen from Equation 4 and Table Ia that for sample G-218, the Seebeck coefficient is 75% higher than measured for bulk or homogeneous film n-type materials for a given carrier concentration. Also in Table Ib, various experimental measurements that have been obtained for the p-type samples are summarized. The large Seebeck coefficient and ZT enhancement found in n-type QDSL films may occur in p-type films. The large increases in Seebeck coefficient and ZT (relative to PbTe) are attributed to the following: (1) a more favorable carrier scattering mechanism due to excess Te (relative to the stoichiometric composition), (2) the presence of PbSe$_{0.98}$Te$_{0.02}$ quantum dots embedded in a PbTe matrix and believed to result in some partial confinement of electrons in the QD's, and (3) we attribute the lowering of the lattice thermal conductivity below the values of the homogeneous pseudobinary PbSe$_x$Te$_{1-x}$ alloys to the enormous density of dissimilar materials interfaces (involving the wetting layer, the PbTe matrix, and the QD's). These dissimilar materials (PbTe/PbSe$_{0.98}$Te$_{0.02}$) are alloys, which block high-frequency phonons due to alloy scattering. Low-frequency phonons are generally unaffected by alloy scattering and may dominate thermal energy flow in an alloy. However, these dissimilar materials (PbTe/PbSe$_{0.98}$Te$_{0.02}$) are superlattices with a high density of quantum dots and scatter low frequency phonons at the dissimilar materials boundaries.

The MBE growth of unusually thick films of both ternary and quaternary QDSL structures was carried out in an Applied Epi 2-inch Gen II MBE growth chamber. The beam equivalent pressures (BEP) of the PbTe, PbSe, and SnSe fluxes were used to calculate the overall composition of alloy films. The BEPs used were the average of measured values before, during, and after growth of each film by placing an ion gauge at the substrate position in the MBE system. The mole fraction, x, of SnSe in the dot layer was calculated by using the relationship given below:

$$x = BEP_{SnSe}/(BEP_{SnSe} + BEP_{PbSe}) \quad (5)$$

where the subscript denotes the BEP of the material being measured. The measured average fluxes, along with the calculated compositions of SnSe, are shown in Table II.

TABLE II

The estimated mean composition (or mole fraction of SnSe) and Eg of the QD part of the Pb$_{1-x}$Sn$_x$Se$_y$Te$_{1-y}$/PbTe QDSL samples as determined by the BEP method, i.e. Equation 4.

| Run Number | BEP$_{SnSe}$ (10$^{-6}$ Torr) | BEP$_{PbSe}$ (10$^{-6}$ Torr) | Approx. Mean SnSe Composition (Eq. 5), x | Estimated Energy Gap (eV) |
|---|---|---|---|---|
| G-224 | 0.37 | 1.91 | 0.16 | 0.12 |
| G-233 | 0.22 | 2.07 | 0.10 | 0.17 |

For growth run G-224 for example, the dot composition is calculated to be (PbSe$_{0.98}$Te$_{0.02}$)$_{0.84}$(SnSe)$_{0.16}$. Comparing with the generic composition, Pb$_{1-x}$Sn$_x$Se$_y$Te$_{1-y}$, the values x=0.160 and y=0.983 are obtained. Thus, from Equation 2 an Eg (eV)=120 meV at 300 K for G-224 was calculated.

In order to find the overall composition of the equivalent homogenized quaternary (EHQ) structure, the formula (PbTe)$_{1-y'}$(Pb$_{1-x}$Sn$_x$Se$_y$Te$_{1-y}$)$_{y'}$ is introduced as the mean PbSnSeTe composition of the structure, i.e. the composition of the material if it was totally homogenized. In order to introduce some systematic variations the mole fraction of PbSnSeTe as y'=0.13 (using Equation 6 below) for the mean PbSnSeTe overall alloy composition. Although approximately fixed for a particular growth run, the dot physical size and a real number density can also be changed systematically by varying the amount of Pb$_{0.84}$Sn$_{0.16}$Se$_{0.983}$Te$_{0.017}$ and PbTe in each layer.

The temperature of the effusion cells are adjusted until the growth rates (GR) are approximately the same for the matrix and dot material (determined in separate calibration growth runs), i.e. GR$_{PbSnSeTe}$=GR$_{PbTe}$. This condition allows for precise control of the composition of the dot material and the matrix material by simply adjusting the relative deposition times. For convenience, then the nominal composition of the equivalent homogeneous quaternary (EHQ) alloy is given approximately by:

$$y' = CC_{PbSnSeTe}/(CC_{PbSnSeTe} + CC_{PbTe}) \quad (6)$$

where CC is the count that is programmed into the computer prior to the growth run for the Pb$_{0.84}$Sn$_{0.16}$Se$_{0.983}$Te$_{0.017}$ part of the deposition and for the PbTe part of the deposition, i.e. the computer counts for each particular shutter arrangement.

For example, during CC$_{PbSnSeTe}$, the PbSe and SnSe shutters covering the PbSe and SnSe effusion cells are open while the PbTe shutter covering the PbTe effusion cell is closed and vice versa for $CC_{PbTe}$. The Te and $Bi_2Te_3$ shutters are kept open throughout the growth runs for these QDSL structures. The Te is supplied to ensure the desired excess Te is maintained. The $Bi_2Te_3$ is used as the n-type dopant. The average beam equivalent fluxes for PbTe, SnSe and PbSe as well as the mean PbSnSeTe composition of the QDSL films are given in Tables II (above) and table III (below).

TABLE III

The approximate composition and period of the mean equivalent quaternary QDSL G-224 and G-233 samples as determined by the BEP/computer count method, i.e. Eqs. 5 and 6.

| Run Number | $BEP_{PbTe}$ ($10^{-6}$ Torr) | Approx. Composition (Eg. 5), y' | Period (Å) |
|---|---|---|---|
| G-224 | 2.12 | 0.13 | 169 |
| G-233 | 2.25 | 0.13 | 223 |

For example, knowing the deposition times from Eq. (6), the mean PbSnSeTe composition of G-224 is calculated as $(PbTe)_{0.87}(Pb_{0.84}Sn_{0.16}Se_{0.983}Te_{0.017})_{0.13}$, which can also be written as $Pb_{0.9792}Sn_{0.0208}Se_{0.1278}Te_{0.8722}$ for the EHQ alloy of the QDSL structure.

The thermoelectric properties of the first quaternary QDSL PbSnSeTe materials are given below in Table IV.

TABLE IV

300-K thermoelectric properties of Bi-doped quaternary PbSnSeTe/PbTe QDSL samples.

| Sample No. | Seebeck Coefficient ($\mu$V/K) | Power Factor ($\mu$W/cm-$K^2$) | ZT* | Carrier Concentration ($cm^{-3}$) | Carrier Mobility ($cm^2$/V-s) |
|---|---|---|---|---|---|
| G-224 | −228 | 33.3 | 1.6 | $1.3 \times 10^{19}$ | 320 |
| G-233 | −241 | 44.2 | 2.0 | $8.9 \times 10^{18}$ | 540 |

*These ZT values are based on lattice thermal conductivity values calculated from the device test data.

The Seebeck coefficient, electrical resistivity, and thermal conductivity (of G-218) are measured values, whereas the lattice thermal conductivity is calculated using the Weidemann-Franz law to be 3.3 mW/cm-K. The ZT values of G-224 and G-233 are the highest ever obtained at room temperature in the Pb-chalcogenide materials.

The EHQ alloy composition for the overall structure of G-224 is $Pb_{0.9792}Sn_{0.0208}Se_{0.1278}Te_{0.8722}$. This EHQ value is used to calculate the lattice constant as 6.415 Å from Eq. 3. Also, the position of the (444) Bragg reflection of G-224 was measured using x-ray diffraction (XRD). This XRD result is used to obtain an independent measurement of the lattice constant of the EHQ alloy as 6.416 Å.

The period of the quaternary QDSL samples was calculated from the growth variables and is given in Table III. The period was also determined to be 165 Å from the XRD (444) satellite peaks for G-224, which is in good agreement with the growth variable method. The number of periods was 251 and 2258 for growth runs G-224 and G-233, respectively. Note that the PbTe matrix or spacer layer and (PbSeTe or PbSeSnTe) dot layer thicknesses are significantly smaller than those observed for thin films of the PbEuTe(spacer layer)/PbSe(dot layer) self-assembled QDSL system.

The following criteria are believed to contribute to the high ZT obtained at 300 K in QDSL materials.

One criterion is that the lattice constant mismatch between the matrix and dot material be approximately 5%. The dot material used for the QDSL structures has a smaller lattice constant than the matrix material. The difference in the lattice constant between PbTe, i.e. 6.461 Å, and the QDSL layer $Pb_{0.84}Sn_{0.16}Se_{0.983}Te_{0.017}$, (i.e. 6.114 Å from Equation 3 for sample G-224) is 5.4%. A lattice constant mismatch is necessary to provide the strain required for the Stranski-Krastanov growth mode to occur and quantum dot structures to be formed.

Another criterion is that both the matrix materials and the dot materials are Pb-based chalcogenide materials. The Pb-salt materials have both desirable QD formation characteristics and high static dielectric constants. High static dielectric constants are advantageous in low temperature TE materials for the suppression of ionized impurity scattering. Hence, relatively high carrier mobilities at high carrier concentrations can occur in both the matrix layers and dot layers. Thus, electrical resistivities are unusually low at the optimal carrier concentration for high ZT. It is also advantageous to have a material with multiple energy-band pockets for the electrons and holes. The PbSnSeTe materials have four pockets for both electrons and holes, which yields a higher density-of-states effective mass than materials having single pockets. The high effective masses lead to relatively high Seebeck coefficients for a given carrier concentration. These factors contribute to the QDSL PbSnSeTe materials having 300 K TE power factors, defined as $(S^2/\rho)$, comparable to bulk $(Bi,Sb)_2(Se,Te)_3$ alloys.

Another criterion is that the ratio of Eg/kT should be approximately six. The optimal 300 K QDSL energy gap is believed to be approximately 0.15 eV for the QDSL material based on TE bulk materials work. For the PbSeTe/PbTe QDSL, the 300 K optical energy gap of the $PbSe_{0.98}Te_{0.02}$ alloy used for the QD layer material is about 0.28 eV, which is too large for an optimized ZT at room temperature.

Yet another criterion is that the matrix material and the QDSL material should be comprised of pseudobinary or pseudoternary alloys, rather than binary compounds. It is well known that, in general, binary compounds have higher lattice thermal conductivities than pseudobinary, e.g. PbSeTe, and pseudoternary, e.g. PbSnSeTe alloys. The lattice thermal conductivity of these alloys at 300 K decreases a factor of 2.0 to 2.5 as x is decreased to 0.5. The lattice thermal conductivity of $Pb_{1-x}Sn_xTe$ pseudobinary alloys behaves like the PbSeTe alloys, i.e. a very low value for x=0.5. This behavior indicates that the PbSnSeTe quaternary alloys may have even lower lattice thermal conductivity values than either PbSeTe or PbSnTe alloys.

Still another criterion is that a large number of interfaces between different but related materials for additional phonon scattering be provided. The potential for extremely low lattice thermal conductivity values for in-plane QDSL materials due to the phase change of materials at interfaces and the effect of the QDs on the phonon group velocity at interfaces exists. A reduction by a factor of approximately two in the in-plane lattice thermal conductivity over in-plane quantum wells was predicted in the present 10 to 15% volume fraction range of dots. A relatively large acoustical mismatch at the interfaces between the QDs and the matrix layer is believed to contribute to the large reduction of the QDSL lattice thermal conductivity (3.3 mW/cm-K) below that of the homogeneous $PbSe_{0.13}Te_{0.87}$ alloy lattice thermal conductivity (11.6 mW/cm-K). A factor of 3.5 reduction below that of the homogeneous psuedobinary alloys.

Finally, the criterion that appropriate band offsets between matrix layers and QDs for quantum confinement of carriers is provided. The large decrease of the Eg of PbSeTe when alloyed with SnSe provides a convenient method for producing a sufficiently large barrier height to achieve a significant quantum confinement of charged carriers within the dots. Thus, the barrier height of PbTe (300 K energy gap or +312 meV) relative to the PbSeTe dots is increased. The dopant is added to both the barrier and dot materials, and the temperature of the dopant effusion cell controls the average carrier concentration of the samples.

As an example, for the G-224 sample listed in table II, the matrix layer comprises PbTe with Eg=312 meV at 300 K whereas the dot/wetting layer consists of a quaternary alloy with an average composition of $Pb_{0.84}Sn_{0.16}Se_{0.983}Te_{0.017}$ with Eg=120 meV at 300 K from Eq. 2. According to Eq. 2, the total bandgap offset between the matrix and dots has been increased from 50 meV to 192 meV (312 meV–120 meV), which enhances carrier confinement within the dots.

For temperatures in the vicinity of 300 K and below, the lattice thermal conductivities for the equivalent quaternary QDSL structures may reach values lower than 3.3 mW/cm-K, due to the combination of alloy and interface phonon scattering in more optimized structures. The physical mechanisms responsible for the enhancement of the Seebeck coefficient are believed to be a more nearly optimized carrier scattering mechanism and quantum effects but other mechanisms may also play a role, such as strain induced shifts of the QD energy levels. QD strain effects may also assist with phonon scattering. Comparison of the luminescence photon energy with that of bulk PbSe shows the strong influence of carrier confinement in PbEuSeTe QDSL structures. Confinement for electrons in n-type and holes in p-type in PbSnSeTe QDSL structures would be expected in view of these results. The optimized engineered structure has the potential to yield still higher values for the Seebeck coefficient and lower values of lattice thermal conductivity than indicated in Table I. ZTs comparable to n-type values may be possible for p-type QDSL structures because of the similarity of the conduction and valence bands in PbSnSeTe materials and the results shown in Table Ib.

In order to better understand the device results that follow, it is helpful to define an operating device or "extrinsic" thermoelectric figure of merit ($Z_dT$). The $Z_dT$ is reduced from the intrinsic ZT (introduced in Eq. 1) by extraneous or parasitic factors such as those listed below. For a unicouple, $$Z_dT = S_u^2 T/R_u K_u \qquad (7)$$

where T is the temperature, and $S_u$ is the sum of the absolute values of the n-type and p-type Seebeck coefficients, $R_u$ is the total electrical resistance and includes both the thermoelement resistances and the contact resistances, and $K_u$ is the total thermal conductance including the thermoelement thermal conductances, junction or contact thermal conductance, as well as other parasitic effects, such as thermal radiation absorbed on the surfaces around the cold junction surface areas, as well as heat absorption at the cold junction from the thermocouple lead wires used to measure the cold junction temperature.

The net rate of transfer of heat, or cooling rate, $E_c$ out of the cold junction region of a unicouple device structure with electrical current flowing is defined as:

$$E_c = S_u T_c I_u - I_u^2 R_u/2 - K_u \Delta T \qquad (8)$$

where $S_u T_c$ is the product of $S_u$ and the cold junction temperature of the device, $T_c$, and $\Delta T$ is the difference in temperature between the hot junction temperature, $T_h$, and $T_c$, i.e, $T_h - T_c$. If Eq. (8) is solved for $\Delta T$, it is seen that the $\Delta T$ is increased upon adjusting experimental conditions such that $E_c \sim 0$ and I is increased until $\Delta T$ reaches a maximum.

The maximum attainable temperature difference, $\Delta T_{max}$, may be determined by maximizing Equation 8 with respect to $I_u$. This leads to the condition $$I_u^* = S_u T_c/R_u \qquad (9)$$

By inserting Eq. (9) in Eq. (8) and using $E_c = 0$, the well-known result obtained is $$\Delta T_{max} = (S_u T_c)^2/2R_u K_u = Z_d T_c^2/2 \qquad (10)$$

For the test that was performed, the TE ternary QDSL device material was cleaved from the as-grown film/substrate wafer. The ends of the TE element were metallized in a glove box containing an inert atmosphere. Then the substrate was removed. The n-type leg, made from ternary growth run G-218, was designed with a thickness of 104 μm, a length of 5.0 mm, and a width of 11.0 mm. The number of superlattice periods was 8005 for G-218. The growth rate was 0.98 μm/hr. A gold ribbon 25 μm thick and 250 μm wide with a length of 5 mm was used in place of the conventional p-type TE leg. Gold is a p-type metal (an n-type metal wire would have worked as well) with a 300K Seebeck coefficient of +2.9 μV/K, electrical resistivity of 2.4 μΩ-cm, and a thermal conductivity of 2800 mW/cm-K with a ZT of 0.00.

Figure 2:
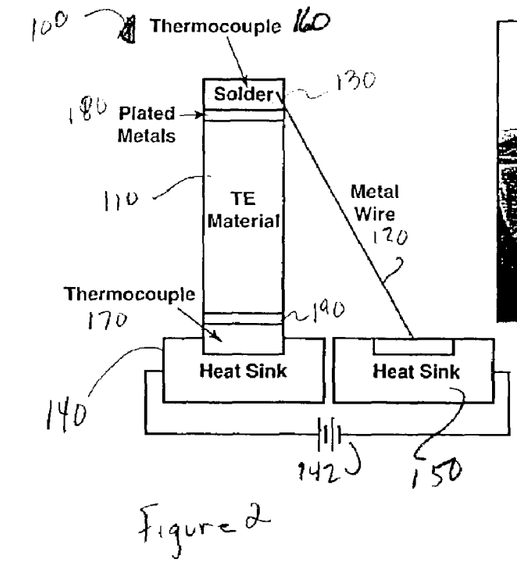
FIG. 2 is a block diagram of the test structure for the device of the present invention.
Figure 3:
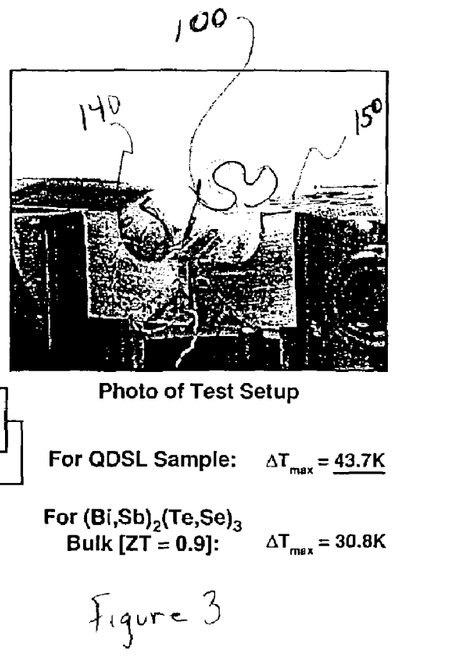
FIG. 3 is a photograph of the device in the test setup.

Referring now to FIGS. 2 and 3 a device 100 made from n-type PbSeTe/PbTe QDSL material 110 (current flow in-plane of QD superlattice) is shown. As shown in FIGS. 2 and 3, when the device 100 is operating in a cooling mode, the positive terminal of power supply 142 is connected to the N-side of the device 100 through heat sink 140. The negative terminal of power supply 142 is connected to the P side of the device 100 through heat sink 150. The electrons in the N-side 110 of the thermoelectric device 100 are carrying heat from the cold-junction region 130 to the hot junction region (the distal end of N-type leg 110 of the thermoelectric device). On the P-type side of the device, the holes are carrying heat from the cold-junction region 130 to the hot junction region (distal end of P-type metal wire 120 of the thermoelectric device). The thermoelectric device 100 is providing a cooling function, and the amount of cooling provided is measured by the temperature difference between the temperatures sensed by first thermocouple 170 and second thermocouple 160.

Figure 4:
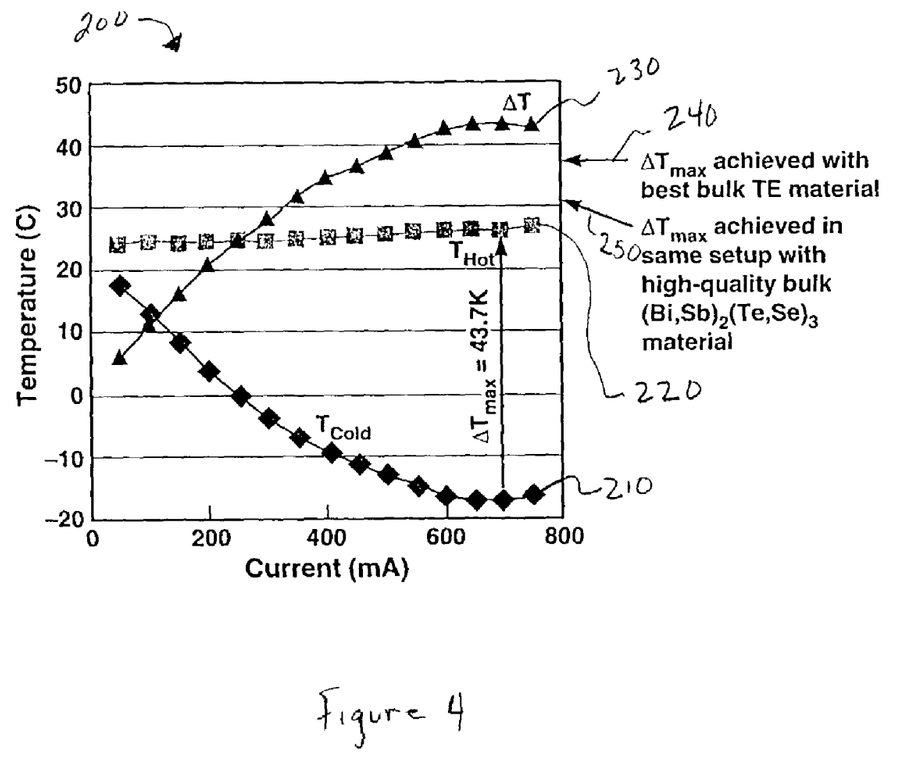
FIG. 4 is a graph showing Temperature versus Current for a one-legged PbSeTe/PbTe QDSL device.

Data relating to $\Delta T$ vs. I was collected and is shown in FIG. 4 in graphical form. A first curve 210 shows the temperature at the cold junction of the TE device at different current values. A second curve 220 shows the temperature at the hot junction of the device. The third curve 230 shows the difference ($\Delta T$) between the cold junction temperature curve 210 and the hot junction temperature curve 220. Also shown for reference are the maximum temperature differences achieved for other TE and bulk material.

The TE device cooled the cold junction region to a temperature ($T_c$), 43.7 K below the hot junction temperature ($T_h$) that was maintained at 299.7 K by large copper heat sinks, i.e. a cooling of $T_c$ down to 256 K. The $T_c$ is located where the n-type thermoelement is joined to a gold wire. Chromel/Alumel thermocouples (TC) with a wire diameter of 0.015 cm and a length of 17 cm were used to measure $T_h$ and $T_c$. Care was taken to ensure that the electrical current had no influence on the TC measurements.

Tests were performed on the device to monitor the TC reading with and without electrical current flowing and zero voltage pickup by the TC was confirmed. TCs were soldered to both the $T_c$ and the junction with the heat sink to measure $T_c$ and $T_h$. The electrical current for the 43.7 K of maximum cooling was 700 mA and the electrical power input was 87 mW. The cold junction was cooled to a temperature of 256 K whereas the room temperature hot junction was near ambient at 299.7 K. The 43.7 K degrees of cooling (without any forced heat removal by blowing air or running water) was significantly greater than the recently reported value of 32.2 K for a similar single one leg $Bi_2Te_3/Sb_2Te_3$ superlattice (current flow cross-plane of superlattice and no quantum dots) device having an equivalent hot junction temperature.

In order to obtain an indication of the parasitic heat flows in the test setup, a n-type bulk $(Bi,Sb)_2(Se,Te)_3$ solid solution alloy material (upper arrow pointing at 37 K (240) in FIG. 4 for case of no parasitics) with a ZT of 0.9 was used for the n-type leg and the gold ribbon for the p-type leg. The material was cleaved to approximately the same aspect ratio (A/L where A is the cross-sectional area and L is the length of a TE leg) from a bulk single crystal quaternary alloy, contacts metallized, and ΔT vs I data was collected. The test device cooled the cold junction region to a temperature ($T_c$), 30.8 K (lower arrow 250 in FIG. 4) below the hot junction temperature ($T_h$) which was maintained at 297.7 K by large copper heat sinks, i.e. a cooling of $T_c$ down to 266.9 K.

Figure 5:
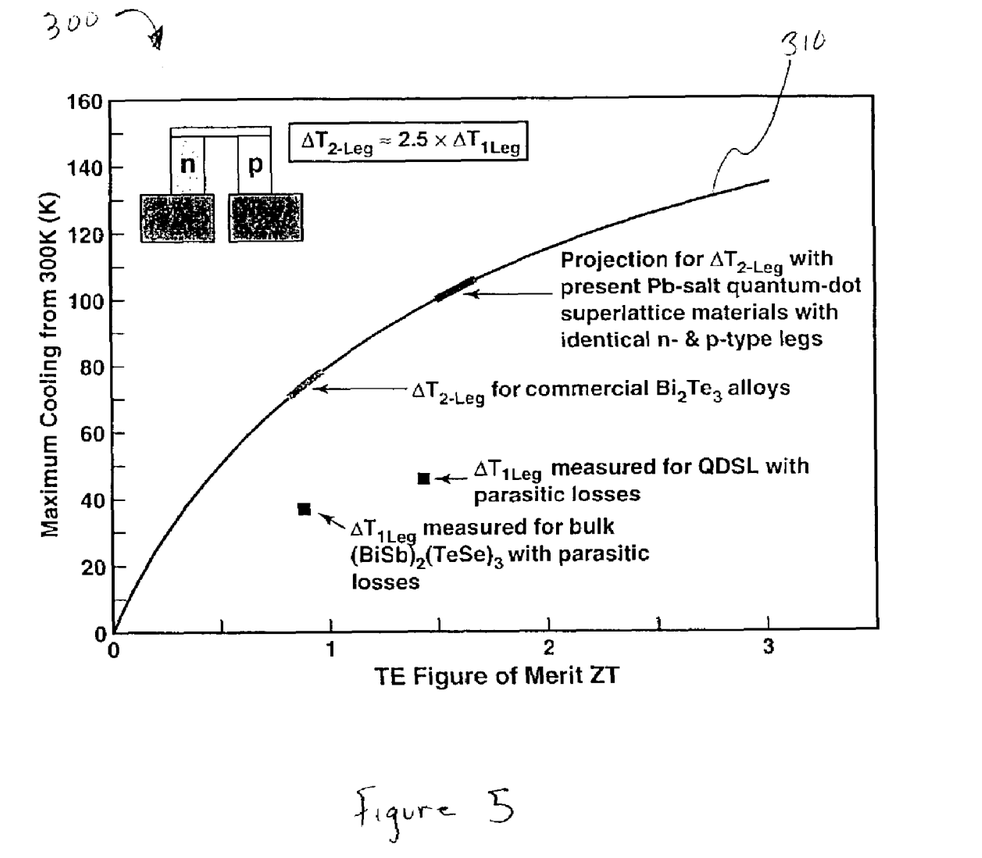
FIG. 5 is a graph of TE Figure of Merit versus Maximum Cooling from 300K for different devices.

Calculations indicate that a p-type QDSL leg with TE properties identical to the n-type would yield a QD unicouple with a material ZT of approximately 1.5, which corresponds to a maximum number of degrees cooling below 300 K of 93 K. We expect greater degrees of cooling to be obtained in the future, as compared to this unoptimized device made from the first bulk-like thick film of PbSeTe/ PbTe nanostructured material, by using quaternary QDSL material for n-type and a similarly high ZT p-type leg. The calculated number of degrees cooling below 300 K for a standard two-leg TE "refrigerator" versus the 300 K ZT are displayed on the curve 310 in FIG. 5.

The thermal conductivity of the QDSL material was calculated as follows. First the $Z_dT$ was calculated using Eq. 10 from the 43.7 $\Delta T_{max}$ and the 256 K $T_c$ measurements. Then the standard equation for the intrinsic ZT of a TE couple was used to calculate the thermal conductivity of the QDSL material as 5.8 mW/cm-K. Upon subtacting the electronic part, the lattice thermal conductivity of the QDSL sample was determined to be 3.3 mW/cm-K.

An unusually thick film TE cooling test device has been made from PbSeTe/PbTe QDSL material with a measured 43.7 K of cooling below room temperature, even though one leg was a zero ZT gold wire. This compares with 30.8 K of cooling for the conventional $(Bi,Sb)_2(Se,Te)_3$ material in the same test setup and the same hot junction temperature. The enhanced TE device performance at 300 K of the PbSeTe/ PbTe QDSL material is believed to be almost entirely due to a high density of essentially 100% PbSe composition of quantum nanodots embedded in a three-dimensional slab matrix of PbTe. The first quaternary PbSnSeTe QDSL TE materials have been grown by MBE and have conservatively estimated ZT values of 2.0 at 300 K.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

What is claimed is:

1. A thermoelectric (TE) device comprising:
a first leg comprising one of an N-type TE material and a P-type TE material; and
a second leg comprising one of an N-type material and a P-type material, wherein when said first leg comprises N-type material said second leg comprises P-type material and when said first leg comprises P-type material said second leg comprises N-type material, said first leg in electrical and thermal communication with said second leg, and wherein said TE device has a lattice constant mismatch and a ratio of Eg/kT such that said TE device has a ZT value of approximately 2.0 at a temperature of approximately 300K wherein said first leg of TE material comprises alternating layers of a quantum dot material and a matrix material, wherein said quantum dot material is selected from the group including a pseudobinary alloy and a pseudoternary alloy, wherein said pseudobinary alloy comprises PbSnTe.

2. The device of claim 1 wherein said quantum dot material comprises $Pb_{1-x}Sn_xTe$.

3. The device of claim 2 wherein x=0.02.

4. A thermoelectric (TE) device comprising:
a first leg comprising one of an N-type TE material and a P-type TE material; and
a second leg comprising one of an N-type material and a P-type material, wherein when said first leg comprises N-type material said second leg comprises P-type material and when said first leg comprises P-type material said second leg comprises N-type material, said first leg in electrical and thermal communication with said second leg, and wherein said TE device has a lattice constant mismatch and a ratio of Eg/kT such that said TE device has a ZT value of approximately 2.0 at a temperature of approximately 300K wherein said first leg of TE material comprises alternating layers of a quantum dot material and a matrix material, wherein said quantum dot material is selected from the group including a pseudobinary alloy and a pseudoternary alloy, wherein said pseudoternary alloy comprises PbSnSeTe.

5. The device of claim 4 wherein said pseudoternary material comprises $Pb_{1-x}Sn_xSe_{1-y}Te_y$.

6. The device of claim 5 wherein x=0.16 and y=0.017.

7. A thermoelectric (TE) device comprising:
a first leg comprising one of an N-type TE material and a P-type TE material; and
a second leg comprising one of an N-type material and a P-type material, wherein when said first leg comprises N-type material said second leg comprises P-type material and when said first leg comprises P-type material said second leg comprises N-type material, said first leg in electrical and thermal communication with said second leg, and wherein said TE device has a lattice constant mismatch and a ratio of Eg/kT such that said TE device has a ZT value of approximately 2.0 at a temperature of approximately 300K wherein said TE material comprises $(Pb_{1-x}Sn_xSe_{1-y}Te_y)_z(PbTe)_{1-z}$.

8. The device of claim 7 wherein x=0.16, y=0.017 and z=0.13.

9. A thermoelectric (TE) device comprising:
a first leg comprising one of an N-type TE material and a P-type TE material; and
a second leg comprising one of an N-type metal and a P-type metal, wherein when said first leg comprises N-type material said second leg comprises P-type metal and when said first leg comprises P-type material said second leg comprises N-type metal, said first leg in electrical and thermal communication with said second leg, and wherein said TE device has a lattice constant mismatch and a ratio of Eg/kT such that said TE device has a ZT value of approximately 2.0 at a temperature of approximately 300K wherein said ratio of Eg/kT for said device comprises approximately six.

10. The device of claim 9 wherein said second leg comprises a metal wire.

11. The device of claim 10 wherein said second leg comprises gold.

12. A thermoelectric (TE) device comprising:
a first leg comprising one of an N-type TE material and a P-type TE material; and
a second leg comprised of a metal wire provided from one of an N-type metal and a P-type metal, wherein when said first leg comprises N-type material said second leg comprises P-type metal and when said first leg comprises P-type material said second leg comprises N-type metal, said first leg in electrical and thermal communication with said second leg.

13. The device of claim 12 wherein said second leg comprises gold.

* * * * *

UNITED STATES PATENT AND TRADEMARK OFFICE
CERTIFICATE OF CORRECTION

PATENT NO. : 7,179,986 B2  Page 1 of 1
APPLICATION NO. : 10/431747
DATED : February 20, 2007
INVENTOR(S) : Harman et al.

It is certified that error appears in the above-identified patent and that said Letters Patent is hereby corrected as shown below:

Column 1, line 40 delete "source a" and replace with --source, a--.

Column 2, line 5 delete "reverse biased" and replace with --reverse biased,--.

Column 2, line 56 delete "follows" and replace with --follows:--.

Column 7, line 8 delete "Tables II (above) and table III" and replace with --Table II (above) and Table III--.

Column 10, line 26 delete "FIGS. 2 and 3 a device" and replace with --FIGS. 2 and 3, a device--.

Column 11, line 12 delete "a n-type" and replace with --an n-type--.

Column 11, line 41 delete "subtacting" and replace with --subtracting--.

Column 11, lines 57-58 delete "invention it" and replace with --invention, it--.

Signed and Sealed this

Fifteenth Day of April, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,179,986 B2 | Page 1 of 1 |
| APPLICATION NO. | : 10/431747 | |
| DATED | : February 20, 2007 | |
| INVENTOR(S) | : Theodore C. Harman et al. | |

It is certified that error appears in the above-identified patent and that said Letters Patent is hereby corrected as shown below:

In column one line 16, under the "Statements Regarding Federally Sponsored Research" section delete the entire paragraph and replace with --This invention was made with government support under Grant No. F19628-95-C-0002 awarded by the US Air Force. The government has certain rights in this invention.--

Signed and Sealed this
Twenty-fourth Day of May, 2011

David J. Kappos
*Director of the United States Patent and Trademark Office*